(12) United States Patent
Wang

(10) Patent No.: US 11,927,526 B2
(45) Date of Patent: Mar. 12, 2024

(54) METHOD AND SYSTEM FOR DETECTING CLEANLINESS IN CAVITY OF TARGET DEVICE

(71) Applicant: CHANGXIN MEMORY TECHNOLOGIES, INC., Hefei (CN)

(72) Inventor: Ben Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 266 days.

(21) Appl. No.: 17/512,894

(22) Filed: Oct. 28, 2021

(65) Prior Publication Data

US 2023/0038908 A1 Feb. 9, 2023

Related U.S. Application Data

(63) Continuation of application No. PCT/CN2021/113677, filed on Aug. 20, 2021.

(30) Foreign Application Priority Data

Aug. 5, 2021 (CN) .......................... 202110896256.5

(51) Int. Cl.
  *G01N 21/25* (2006.01)
  *C23C 16/44* (2006.01)
  *G01N 21/27* (2006.01)

(52) U.S. Cl.
  CPC ....... *G01N 21/255* (2013.01); *C23C 16/4401* (2013.01); *G01N 21/27* (2013.01)

(58) Field of Classification Search
  CPC ... A61B 5/0059; A61B 5/0075; B24B 37/013; B24B 49/04; C23C 16/4401; G01B 11/24; G01J 1/32; G01J 3/0297; G01J 3/433; G01J 5/02; G01N 21/255; G01N 21/27; G01N 21/6458; G01N 21/8422; G01N 21/94; H01J 37/32935
  (Continued)

(56) References Cited

U.S. PATENT DOCUMENTS

2012/0167325 A1*  7/2012  Omidi ................. A47L 23/26
                                                    15/210.1
2012/0171600 A1*  7/2012  Catey ................... G03F 7/7065
                                                    430/30
(Continued)

FOREIGN PATENT DOCUMENTS

CN     102460527 A    5/2012
CN     106409712 A    2/2017
(Continued)

OTHER PUBLICATIONS

First Office Action of the Chinese application No. 202110896256.5, dated Feb. 23, 2022, 24 pgs.

*Primary Examiner* — Stephen R Burgdorf
(74) *Attorney, Agent, or Firm* — Cooper Legal Group, LLC

(57) ABSTRACT

A device detection method and system are provided. The method includes: acquiring first spectral intensity graphs for predetermined regions in the cavity of the target device; acquiring second spectral intensity graphs for the predetermined regions when the target device has finished N processing tasks, where N is a natural number; and detecting the cleanliness in the cavity of the target device according to the first spectral intensity graphs and the second spectral intensity graphs.

11 Claims, 6 Drawing Sheets

(58) Field of Classification Search
USPC .......................................................... 340/635
See application file for complete search history.

(56) References Cited

U.S. PATENT DOCUMENTS

| | | | | |
|---|---|---|---|---|
| 2015/0026945 A1* | 1/2015 | Park | ....................... | H10K 77/10 |
| | | | | 29/407.01 |
| 2016/0061747 A1* | 3/2016 | Lee | .................... | B01D 46/0086 |
| | | | | 356/73 |
| 2016/0231234 A1* | 8/2016 | Hensley | ................. | G01N 21/94 |
| 2016/0299062 A1* | 10/2016 | Marbach | .............. | G01N 21/359 |
| 2018/0082827 A1* | 3/2018 | Choi | ................. | H01J 37/32853 |
| 2019/0033225 A1* | 1/2019 | Chang | ................. | G03F 7/70033 |
| 2019/0086296 A1* | 3/2019 | West | ....................... | G06V 20/20 |
| 2020/0025706 A1* | 1/2020 | Yu | .......................... | G01N 27/38 |

FOREIGN PATENT DOCUMENTS

| | | | |
|---|---|---|---|
| CN | 108344747 | A | 7/2018 |
| CN | 109791900 | A | 5/2020 |
| CN | 109791900 | B | 5/2020 |
| CN | 111580393 | A | 8/2020 |
| CN | 112185833 | A | 1/2021 |
| SU | 131539 | A1 | 11/1960 |

\* cited by examiner

METHOD AND SYSTEM FOR DETECTING CLEANLINESS IN CAVITY OF TARGET DEVICE

CROSS-REFERENCE TO RELATED APPLICATION

This application is a continuation of International Application No. PCT/CN2021/113677, filed on Aug. 20, 2021, which claims priority to Chinese patent application No. 202110896256.5, filed on Aug. 5, 2021. The disclosures of International Application No. PCT/CN2021/113677 and Chinese patent application No. 202110896256.5 are hereby incorporated by reference in their entireties.

BACKGROUND

In related art, contaminants can be left in the chamber of a semiconductor device when various processes are performed in the chamber. For example, when a deposition process is performed in a semiconductor device, deposits will not only be deposited on the workpiece, but also in on the inner wall of the chamber and on other components of the chamber. The deposits on the inner wall and other components may crack or peel off, thus causing contaminants to fall on the workpiece, which makes the workpiece damaged and unusable. Therefore, it is an urgent problem to provide a method capable of detecting the cleanliness in the chamber of the semiconductor device.

SUMMARY

Embodiments of this application relate to, but are not limited to, a device detection method and system.

The embodiments of this application provide a device detection method, for detecting a target device, which includes:

One or more first spectral intensity graphs for one or more predetermined regions in the cavity of the target device are acquired;

One or more second spectral intensity graphs for the one or more predetermined regions when the target device has finished N processing tasks, where N is a natural number; and A cleanliness in a cavity of the target device is detected according to the one or more first spectral intensity graphs and the one or more second spectral intensity graphs.

The embodiments of this application provide a device detection system, which at least includes a spectrometer and an analysis device.

The spectrometer is configured to form one or more second spectral intensity graphs for one or more predetermined regions in a cavity of a target device when the target device has finished N processing tasks.

The analysis device is electrically connected to the spectrometer, and is configured to receive one or more first spectral intensity graphs and the one or more second spectral intensity graphs for the one or more predetermined regions in the cavity of the target device, and detect a cleanliness in the cavity of the target device according to the one or more first spectral intensity graphs and the one or more second spectral intensity graphs.

BRIEF DESCRIPTION OF THE DRAWINGS

In the drawings (which are not necessarily drawn to scale), similar reference numerals may describe similar components in different views. Similar reference numerals with different letter suffixes may indicate different examples of similar components. The accompanying drawings generally show the various embodiments discussed herein by way of example and not limitation.

DETAILED DESCRIPTION

Figure 1:
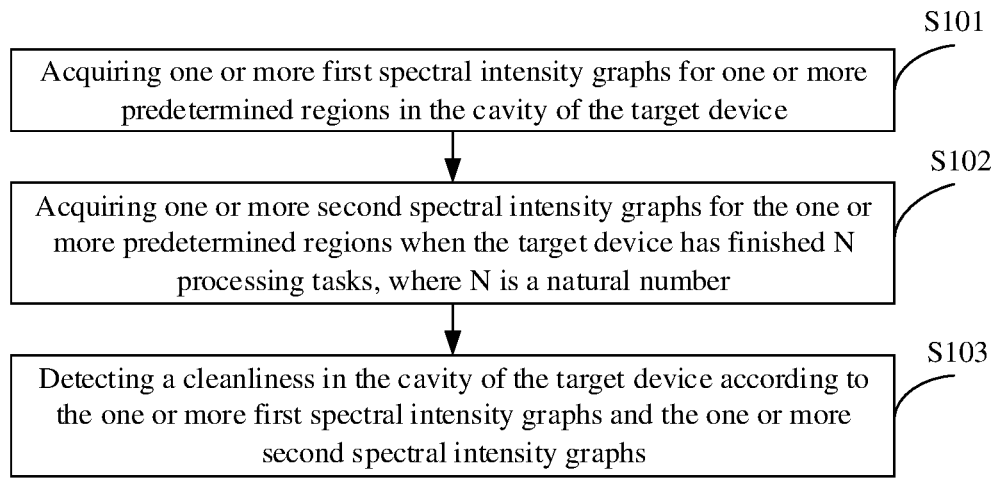
FIG. 1 illustrates a first schematic flowchart of the device detection method provided by the embodiments of this application.

The specific technical solutions of this application will be described in further detail below in combination with the drawings in the embodiments of this application. The following embodiments are used to illustrate this application, but are not used to limit the scope of this application.

In the following description, a lot of specific details are given in order to provide a more thorough understanding of this application. However, it is obvious to those skilled in the art that this application can be implemented without one or more of these details. In other examples, in order to avoid confusion with this application, some technical features known in the art are not described; that is, all the features of the actual embodiments are not described here, and the well-known functions and structures are not described in detail.

In the drawings, the sizes of layers, regions, and elements and their relative sizes may be exaggerated for clarity. The same reference numerals denote the same elements throughout.

It should be understood that when an element or layer is referred to as being "on", "adjacent to", "connected to" or "coupled to" other elements or layers, it can be directly on the other elements or layers, it can be adjacent to, connected or coupled to other elements or layers, or intervening elements or layers may be present. In contrast, when an element is referred to as being "directly on", "directly adjacent to", "directly connected to" or "directly coupled to" other elements or layers, there are no intervening elements or layers. It should be understood that although the terms first, second, third, etc. may be used to describe various elements, components, regions, layers and/or parts, these elements, components, regions, layers and/or parts should not be limited by these terms. These terms are only used to distinguish one element, component, region, layer or part from another element, component, region, layer or part. Therefore, without departing from the teachings of this application, the first element, component, region, layer or part discussed below may be represented as a second element, component, region, layer or part. When the second element, component, region, layer or part is discussed, it does not mean that the first element, component, region, layer or part is necessarily present in this application.

Spatial relation terms such as "under . . . ", "below . . . ", "lower", "under . . . of", "above . . . ", "upper", etc., can be used here for convenience so as to describe the relationship between one element or feature shown in the figure and other elements or features. It should be understood that in addition to the orientations shown in the figures, the spatial relationship terms are intended to include different orientations of devices in use and operation. For example, if the device in the drawings is turned over, then elements or features described as "below" other elements or "under . . . of" or "under" will be oriented "on" the other elements or features. Therefore, the exemplary terms "below" and "under" may include both an orientation of above and below. The device can be otherwise oriented (rotated by 90 degrees or other orientations) and the spatial descriptors used here are interpreted accordingly.

The objective of the terms used here is not used as a limitation of this application, but is only to describe specific embodiments. When used herein, the singular forms of "a", "an" and "the/this" are also intended to include plural forms, unless the context clearly indicates otherwise. It should also be understood that the terms "compose" and/or "include", when used in this specification, determine the existence of the described features, integers, operations, operations, elements and/or components, but do not exclude the existence or addition of one or more other features, integers, operations, operations, elements, components, and/or groups. As used herein, the term "and/or" includes any and all combinations of related listed items.

In the related art, as the line width of semiconductors gradually becomes smaller, the tolerance for particles falling from the machine itself becomes smaller and smaller. Usually, the increase in the number of defects on the surface of the workpiece before and after a process is measured by a measuring machine to determine whether there is a drop of particles. For example, in the related art, the workpiece (which can be a wafer) is scanned three times by the measuring machine, the images after the three scans are compared, and the number of defects on the wafer surface after each scan is calculated so as to determine whether particles are falling from the measuring machine. That is to say, in the related art, the detection of the falling of the particles can be performed on the measuring machine only when a workpiece exists. In such a way, a blind region may exist during the detection of the falling of the particles for the measuring machine. Therefore, it is impossible to detect whether the falling of the particles exists for all regions of the measuring machine.

Based on the problems in the related art, embodiments of this application provide a device detection method, the cleanliness in the cavity of the target device is detected by acquiring first spectral intensity graphs for predetermined regions in the cavity of the target device, acquiring second spectral intensity graphs for the predetermined regions in the cavity of the target device after N processing tasks have been performed, and comparing the first spectral intensity graphs and the second spectral intensity graphs. In this way, with the device detection method provided by the embodiments of this application, the cleanliness in the cavity of the target device can be detected without a workpiece, and all regions inside the cavity can be detected, which improves the detection efficiency and detection accuracy.

FIG. 1 illustrates a first schematic flowchart of the device detection method provided by the embodiments of this application. As shown in FIG. 1, the device detection method provided by the embodiments of this application can be achieved by the following operations.

In operation S101, one or more first spectral intensity graphs for one or more predetermined regions in the cavity of the target device are acquired.

In the embodiments of this application, the target device has a cavity. When the target device performs a workpiece processing task on the workpiece, all the process operations are completed in the cavity. Here, the workpiece may refer to a structure to be processed that can be processed by the target device, such as a wafer.

In some embodiments, the predetermined regions in the cavity can be regions divided by the technician according to the cavity structure. The predetermined regions are located at least on the inner bottom plate, inner side wall or inner top plate of the target device cavity, so that the cleanliness detection can be performed for all of the regions in the cavity by the device detection method provided in the embodiments of this application, without a blind region that cannot be detected.

It should be noted that the spectral intensity graph in the embodiments of this application may be measured by a spectrometer.

In some embodiments, the first spectral intensity graph may be a spectral intensity graph for each one of the predetermined regions measured by a spectrometer when the target device has not yet performed processing task. However, after the target device has performed the process tasks, the material on the inner surface of the cavity will slowly change, causing the spectral intensity graph for each predetermined region in the cavity to also change. Therefore, the first spectral intensity graph can also be the spectral intensity graph for each predetermined region measured by a spectrometer after each productive maintenance (PM).

In Operation S102, when the target device has finished N processing tasks, one or more second spectral intensity graphs for the one or more predetermined regions are acquired, where N is a natural number.

In some embodiments, the processing task refers to a process processing task for the workpiece implemented in the target device, such as a deposition process. The second spectral intensity graph refers to a spectral intensity graph for each predetermined region in the target device after the target device has finished N processing tasks, and the value of N can be set by the technician, and is not limited in the embodiments of this application. Here, the second spectral intensity graph can be measured by a spectrometer.

In Operation S103, a cleanliness in the cavity of the target device is detected according to the one or more first spectral intensity graphs and the one or more second spectral intensity graphs.

In some embodiments, detecting the cleanliness in the cavity of the target device refers to detecting whether there are particles or contaminants in the cavity of the target device. The particles or contaminants in the target device can be particles falling from the inner wall of the cavity of the target device, particles falling from the components in the cavity of the target device, or fibers left from a dust-free cloth with which the technician wipes the inner wall of the cavity of the target device during repairing the device.

In some embodiments, detecting the cleanliness in the cavity of the target device according to the first spectral intensity graphs and the second spectral intensity graphs refers to determining whether there is a difference between the first spectral intensity graph and the second spectral intensity graph for each of the predetermined regions, when the second spectral intensity graph for the predetermined region is different from the first spectral intensity graph for the predetermined region, it means that particles or other contaminants exist in the region.

According to the embodiments of this application, by acquiring the first spectral intensity graph for a predetermined region in the cavity of the target device, acquiring the second spectral intensity graph for the predetermined region in the cavity of the target device after N processing tasks have been performed, and comparing the first spectral intensity graph and the second spectral intensity graph, the cleanliness in the cavity of the target device can be detected. In this way, with the device detection method provided by the embodiments of this application, the cleanliness in the cavity of the target device can be detected without a workpiece, and all regions inside the cavity can be detected, which improves the detection efficiency and detection accuracy.

Figure 2:
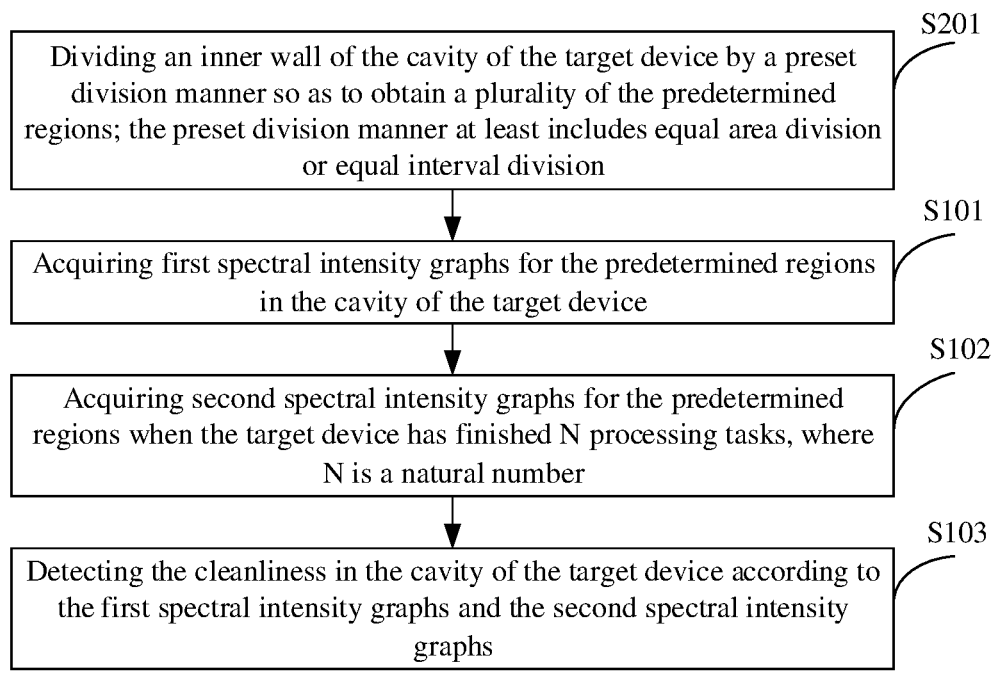
FIG. 2 illustrates a second schematic flowchart of the device detection method provided by the embodiments of this application.

In some embodiments, in order to detect the cleanliness in the cavity of the target device more accurately, the region division may be performed on the inner wall of the cavity of the target device. According to the above embodiment, FIG. 2 illustrates a second schematic flowchart of the device detection method provided by the embodiments of this application. As shown in FIG. 2, before Operation S101, the embodiments of this application may further include the following operations.

Operation S201, the inner wall of the cavity of the target device is divided in a preset division manner so as to obtain a plurality of the predetermined regions. Herein, the preset division manner at least includes: equal area division or equal interval division.

In some embodiments, when the region division is performed on the inner wall of the cavity of the target device, the division manner can be selected according to the structure inside the cavity of the target device. For example, when the inner wall of the cavity of the target device is relatively flat, the inner wall of the cavity of the target device can be divided in the equal area division manner or the equal interval division manner so as to obtain predetermined regions with a same region or a same interval. When there are many components within the target device or the structure of the internal components is more complicated, the inner wall of the cavity can be divided according to the structure of the internal components so as to obtain the predetermined regions corresponding to each of the components, so that the spectral intensity graphs can be obtained for all regions of the inner wall of the cavity.

In the embodiments of this application, the inner wall of the cavity of the target device is divided in a preset division manner, so that the cleanliness detect can be performed for all regions in the inner wall of the cavity, thereby avoiding detection blind regions when performing cleanliness detection on the target device, and improving the accuracy of the cleanliness detection of the target device.

Figure 3:
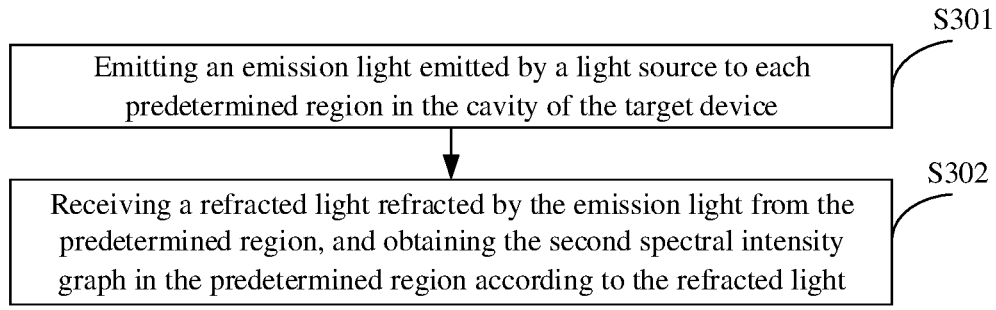
FIG. 3 illustrates a third schematic flowchart of the device detection method provided by the embodiments of this application.

According to the above embodiment, FIG. 3 illustrates a third schematic flowchart of the device detection method provided by the embodiments of this application. As shown in FIG. 3, acquiring the one or more second spectral intensity graphs for the one or more predetermined regions in Operation S102 can be implemented by the following operations.

In Operation 301, the emission light emitted by a light source is emitted to each predetermined region in the cavity of the target device.

In Operation 302, a refracted light refracted by the emission light from the predetermined region is received, and a second spectral intensity graph for the predetermined region is obtained according to the refracted light.

In the embodiments of this application, the system for detecting the cleanliness of the target device may be provided with a light source for emitting the emission light and a light signal receiver for receiving light signals. When the spectral intensity graph is acquired, the emission light emitted by the light source is emitted to each predetermined region in the cavity of the target device, the emission light is refracted from the predetermined region, and the optical signal receiver receives the refracted light refracted by the predetermined region. The spectrometer is connected with the optical signal receiver, and the spectrometer generates the second spectral intensity graph for each predetermined region of the target device according to the refracted light after the processing task is performed.

In the embodiments of this application, the refracted light in each predetermined region is received by a spectrometer, and the second spectral intensity graph for the predetermined region of the target device after the processing task is performed is generated by the spectrometer, so that the acquired second spectral intensity graph can be compared with the first spectral intensity graph to obtain the cleanliness for the region.

Figure 4:
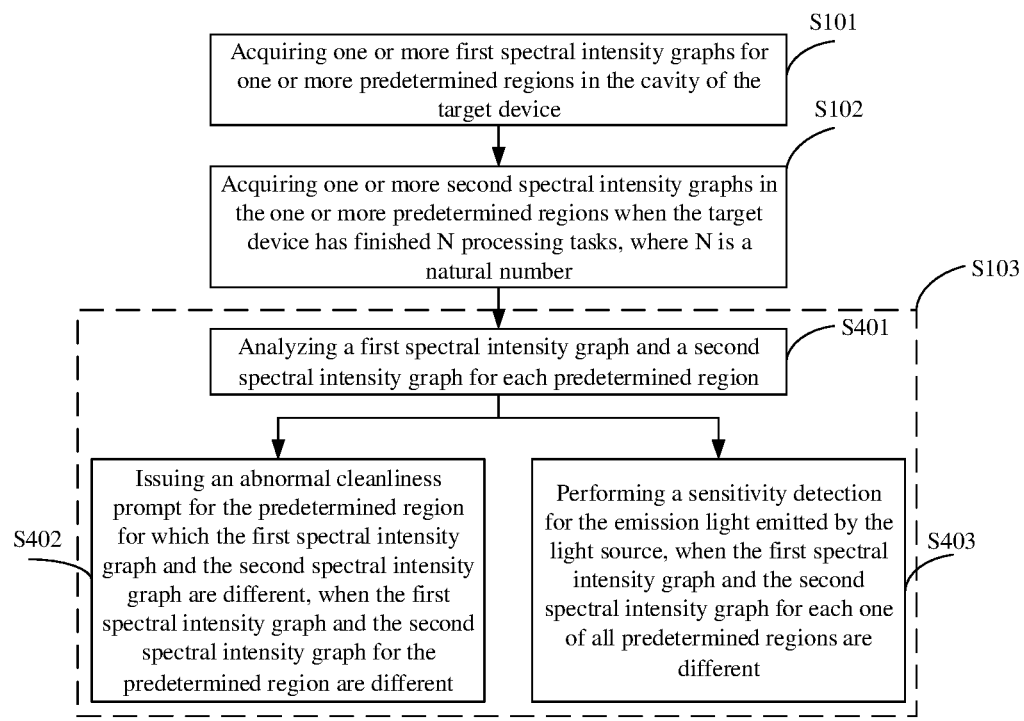
FIG. 4 illustrates a fourth schematic flowchart of the device detection method provided by the embodiments of this application.

According to the above embodiments, FIG. 4 illustrates a fourth schematic flowchart of the device detection method provided by the embodiments of this application. As shown in FIG. 4, Operation S103 can be achieved by the following operations.

In Operation S401, a first spectral intensity graph and a second spectral intensity graph for each one predetermined region are analyzed.

In some embodiments, the system for detecting the cleanliness of the target device may also be provided with an analysis device. The analysis device is configured to receive a first spectral intensity graph and a second spectral intensity graph for each predetermined region, and detect the cleanliness in the cavity of the target device by determine whether there is a difference between the first spectral intensity graph and the second spectral intensity graph.

In Operation S402, when the first spectral intensity graph and the second spectral intensity graph for a certain predetermined region are different, an abnormal cleanliness prompt for the predetermined region, for which the first spectral intensity graph and the second spectral intensity graph are different, is issued.

In some embodiments, when the second spectral intensity graph for a certain predetermined region among all predetermined regions in the inner wall of the cavity of the target device is different from the first spectral intensity graph for the predetermined region, it means that particles or contaminants exist in the region.

In some embodiments, the analysis device may be provided with an abnormal prompt structure. When the second spectral intensity graph for a certain predetermined region is different from the first spectral intensity graph for the predetermined region, the abnormal prompt structure may issue an abnormal prompt for the predetermined region so as to prompt the technician.

In some embodiments, the analysis device can also be provided with a display panel and a voice unit. When the abnormal prompt structure is required to issue an abnormal prompt, the abnormal text prompt may be displayed through the display panel. The text prompt includes at least: the problem region and the problem description. When the abnormal prompt structure is required to issue an abnormal prompt, the abnormal voice prompt may also be issued through the voice unit. The voice prompt can be a "di di" sound, or it can be a voice broadcast of the problem region and the problem description through the voice. The embodiments of this application may also provide other feasible abnormal prompt solutions, which are not limited by the embodiments of this application.

In Operation S403, a sensitivity detection on the emission light emitted by the light source is performed, when the first spectral intensity graph and the second spectral intensity graph for each one of all predetermined regions are different.

In some embodiments, if the second spectral intensity graph and the first spectral intensity graph for each one of all predetermined regions in the target device are different, it is necessary to not only check each of the predetermined regions in the target device, but also check whether the emission light emitted by the light source is abnormal, and it is necessary to perform sensitivity detection on the emission light emitted by the light source.

Figure 5:
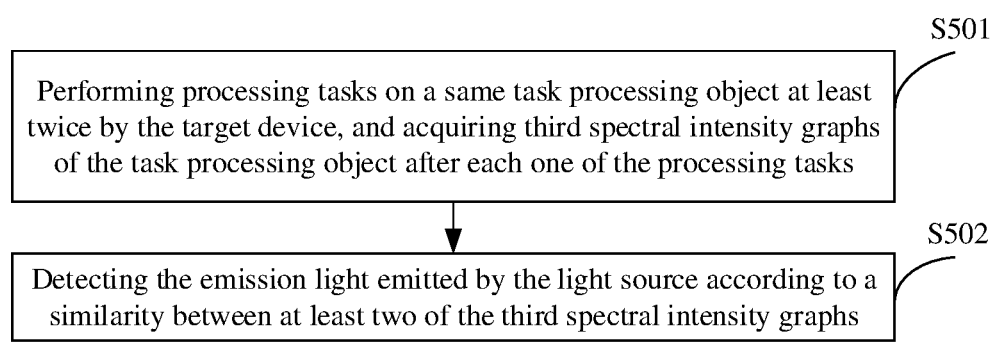
FIG. 5 illustrates a fifth schematic flowchart of the device detection method provided by the embodiments of this application.

In some embodiments, FIG. 5 illustrates a fifth flowchart of the device detection method provided by the embodiments of this application. As shown in FIG. 5, performing the sensitivity detection on emission light can be achieved by the following operations.

In Operation S501, at least two processing tasks are executed by the target device on a same task processing object, and third spectral intensity graphs of the task processing object are acquired after each one of the at least two processing tasks.

In some embodiments, a plurality of processing tasks can be performed on the same workpiece and the third spectral intensity graphs of the workpiece after each processing task are acquired. The sensitivity detection is performed on the light emitted by the light source by comparing the third spectral intensity graphs of the workpiece acquired after each processing task. If the difference between the third spectral intensity graphs of the workpiece acquired after each processing task is small, it means that the light emitted by the light source is normal.

It should be noted that performing at least two processing tasks on the same task processing object refers to performing the same processing task twice on the same workpiece.

In Operation S502, the emission light emitted by the light source is detected according to the similarity between at least two of the third spectral intensity graphs.

Figure 6:
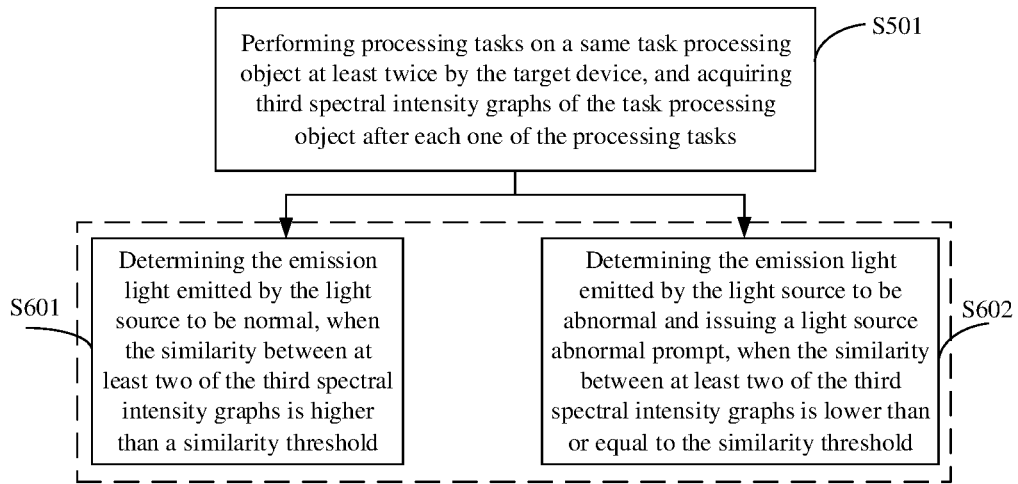
FIG. 6 illustrates a sixth schematic flowchart of the device detection method provided by the embodiments of this application.

In some embodiments, FIG. 6 illustrates a sixth alternative flowchart of the device detection method provided by the embodiments of this application. As shown in FIG. 6, detecting the emitted light according to the similarity between the third spectral intensity graph can be achieved by the following operations.

In Operation S601, the emission light emitted by the light source is determined to be normal, when the similarity between at least two of the third spectral intensity graphs is higher than the similarity threshold.

Here, the similarity threshold can be set by the technician according to the target device. When the target device is a new device or there is no obvious aging phenomenon inside the chamber of the target device, the similarity threshold can be set relatively high, for example: 95%, when the similarity is greater than 95%, the emission light emitted by the light source is determined to be normal.

Or, when there is obvious aging phenomenon inside the chamber of the target device, every time the target device performs a processing task, subtle changes may occurred inside the device, thus causing changes in the spectral intensity graph. Therefore, in this case, the value of the similarity threshold of the target device can be set relatively low, for example: 80%, when the similarity is greater than 80%, the emission light emitted from the light source is determined to be normal.

In some embodiments, during the emission light sensitivity detection, at least two third spectral intensity graphs will be acquired, and the third spectral intensity graphs need to be compared in pairs, when the similarity between every two third spectral intensity graphs is higher than the similarity threshold, the emission light emitted from the light source is determined to be normal.

In Operation S602, the emission light emitted by the light source is determined to be abnormal and a light source abnormal prompt is issued, when the similarity between at least two of the third spectral intensity graphs is lower than or equal to the similarity threshold.

In some embodiments, when the similarity between every two third spectral intensity graphs is lower than or equal to the similarity threshold, the emission light emitted from the light source is determined to be abnormal, and the abnormal voice prompt or abnormal text prompt may be emitted by the abnormal prompt structure of the analysis device.

In the embodiments of this application, the sensitivity of the light source is detected based on the third spectral intensity graph, which avoids the problem of inaccurate cleanliness detection on the target device due to the light source abnormality, and improves the accuracy of cleanliness detection.

Figure 7:
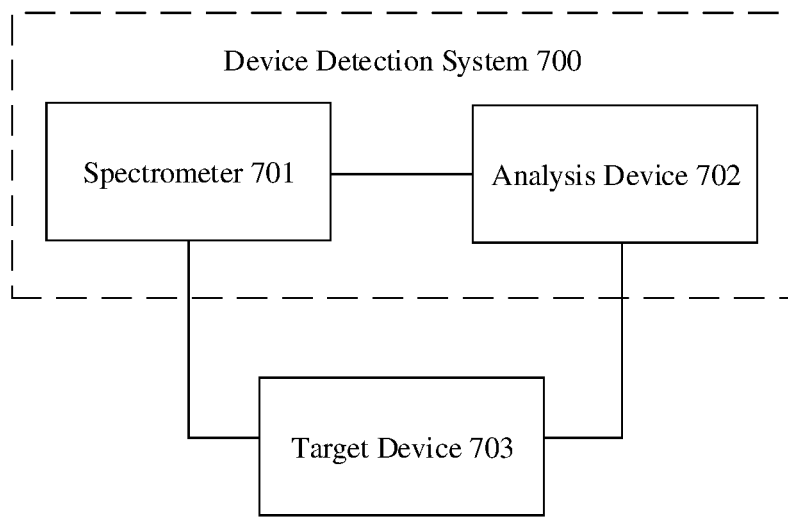
FIG. 7 illustrates a first schematic structure diagram of the device detection system provided by the embodiments of this application.

According to the above embodiments, the embodiments of this application provide a device detection system for performing cleanliness detection on a target device. FIG. 7 illustrates a first schematic structure diagram of the device detection system provided by the embodiments of this application. As shown in FIG. 7, the device detection system 700 provided by the embodiments of this application at least includes a spectrometer 701 and an analysis device 702.

The spectrometer 701 is configured to form one or more second spectral intensity graphs for one or more predetermined regions in a cavity of a target device when a target device 703 has finished N processing tasks.

The analysis device 702 is electrically connected to the spectrometer 701 and is configured to receive one or more first spectral intensity graphs and the one or more second spectral intensity graphs for one or more predetermined regions in the cavity of the target device, and detect the cleanliness in the cavity of the target device 703 according to the one or more first spectral intensity graphs and the one or more second spectral intensity graphs.

Figure 8:
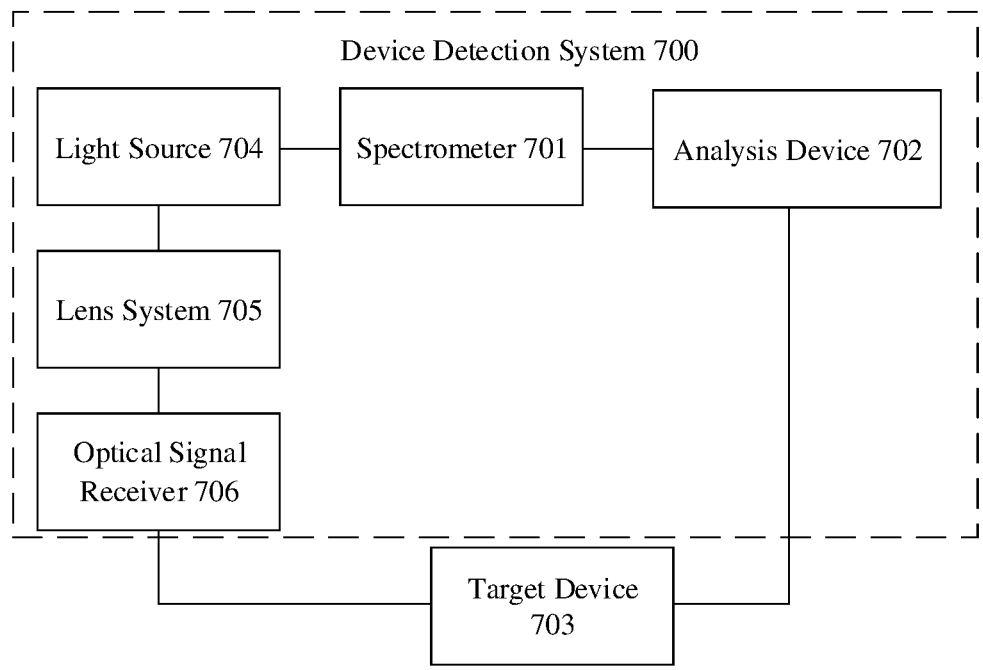
FIG. 8 illustrates a second schematic structure diagram of the device detection system provided by the embodiments of this application.

In some embodiments, FIG. 8 illustrates a second schematic structure diagram of the device detection system provided by the embodiments of this application. As shown in FIG. 8, the device detection system 700 further includes a light source 704, a lens system 705 and an optical signal receiver 706.

The light source 704 is electrically connected to the spectrometer 701, for emitting the emission light.

The lens system 705 is electrically connected to the light source 704, and is configured to refract the emission light emitted by the light source 704 to each one of the one or more predetermined regions.

The optical signal receiver 706 is electrically connected to the lens system 705, and is configured to receive a refracted light refracted by the emission light from each one of the one or more predetermined regions and transmit an optical signal of the refracted light to the spectrometer 701.

In some embodiments, the lens system includes at least two zoom lenses, each of which is configured to refract the emission light emitted from the light source to a certain predetermined region. That is to say, the lens system provided by the embodiments of the application can refract the emission light emitted from the unified light source to each of the predetermined regions in the cavity of the target device through the zoom lens, so that the device detection system provided by the embodiments of the application can reduce the detection blind region and improve the accuracy of device detection.

Figure 9:
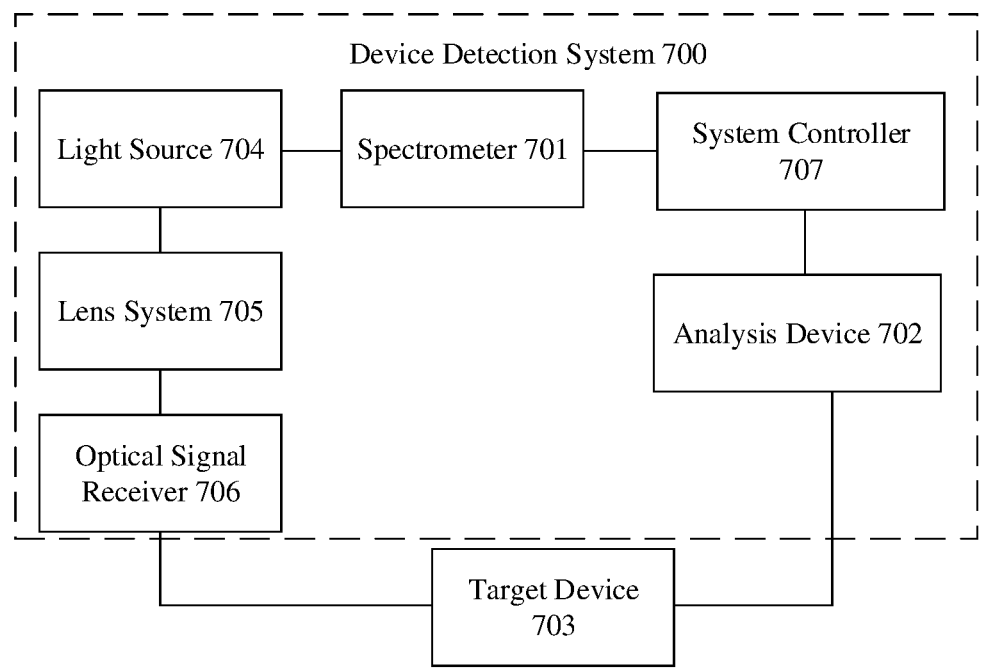
FIG. 9 illustrates a third schematic structure diagram of the device detection system provided by the embodiments of this application.

In some embodiments, FIG. 9 illustrates a third schematic structure diagram of the device detection system provided by the embodiments of this application. As shown in FIG. 9, the device detection system further includes: a system controller 707. The system controller is respectively electrically connected to the spectrometer 701 and the analysis device 702, and configured to control the device detection system 700 to perform cavity cleanliness detection on the target device 703.

Figure 10:
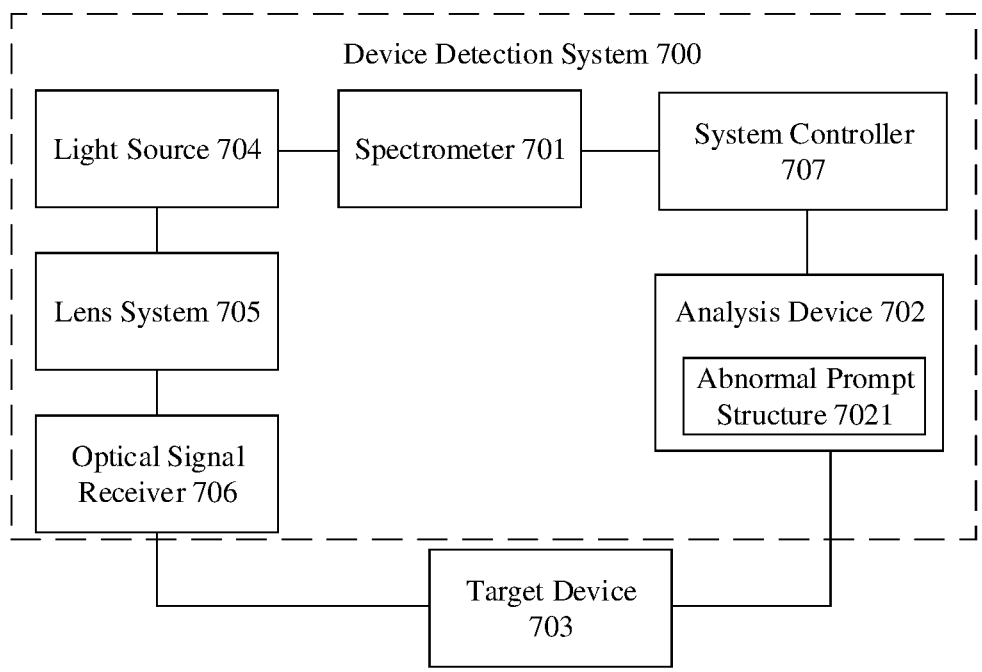
FIG. 10 illustrates a fourth schematic structure diagram of the device detection system provided by the embodiments of this application.

In some embodiments, FIG. 10 illustrates a fourth schematic structure diagram of the device detection system provided by the embodiments of this application. As shown in FIG. 10, the device detection system further includes: an abnormal prompt structure 7021, that is located in the analysis device 702, and configured to issue an abnormal voice prompt or abnormal text prompt, when a first spectral intensity graph and a second spectral intensity graph in a certain predetermined region are different, or when the emission light emitted by the light source 704 is abnormal.

In some embodiments, the predetermined region is located at least on an inner bottom plate, an inner side wall, or an inner top plate in the cavity of the target device.

In some embodiments, the target device is a measuring device or a process device.

According to the device detection system provided by the embodiments of this application, the spectrometer in the system acquires one or more first spectral intensity graphs in the cavity of the target device and acquires one or more second spectral intensity graphs in the cavity of the target device after N processing tasks have been performed. Then the analysis device compares the one or more first spectral intensity graphs and the one or more second spectral intensity graphs to detect the cleanliness in the cavity of the target device. In this way, by the device detection system provided by the embodiments of this application, the cleanliness in the cavity of the target device can be detected without a workpiece, and all regions inside the cavity can be detected, which improves the detection efficiency and detection accuracy.

An exemplary application in the embodiments of this application in an actual application scenario will be described below.

Figure 11:
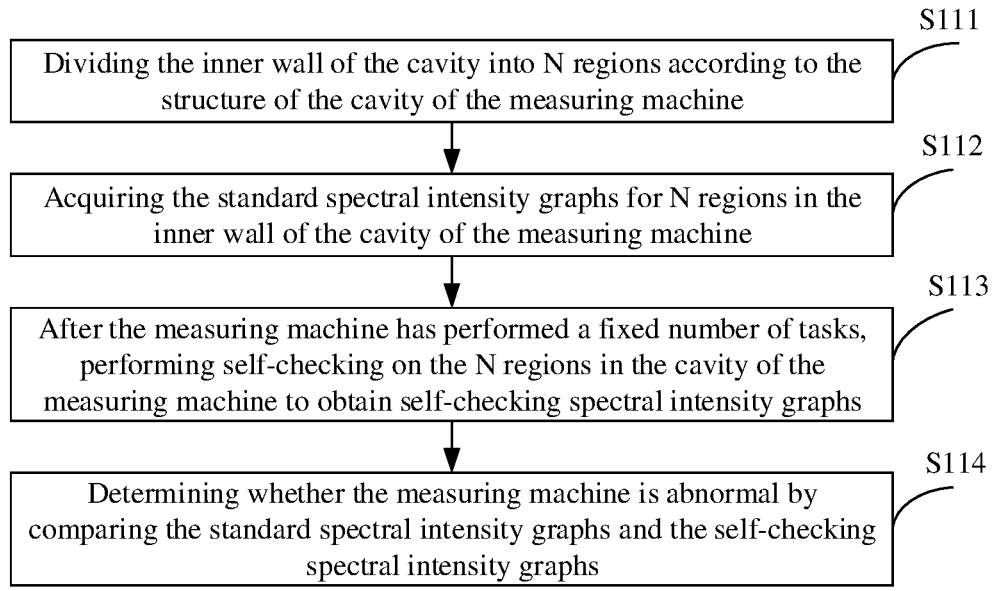
FIG. 11 illustrates an alternative schematic flowchart of the device detection method provided by the embodiments of this application.

FIG. 11 illustrates an alternative schematic flowchart of the device detection method provided by the embodiments of this application. As shown in FIG. 11, the device detection method provided by the embodiment of this application can be implemented by the following operations.

In Operation S111, according to the structure of the cavity of the measuring machine, the inner wall of the cavity is divided into N regions.

In Operation S112, standard spectral intensity graphs for N regions in the inner wall of the cavity of the measuring machine are acquired.

In Operation S113, after the measuring machine has performed a fixed number of tasks, a self-checking is performed on the N regions in the cavity of the measuring machine to obtain self-checking spectral intensity graphs.

In Operation S114, whether the measuring machine is abnormal is determined by comparing the standard spectral intensity graphs and the self-checking spectral intensity graphs.

In some embodiments, the standard spectral intensity graph (that is, the first spectral intensity graph) may be provided by the manufacturer of the measuring machine (that is, the target device), or may be detected by the technicians themselves.

Figure 12:
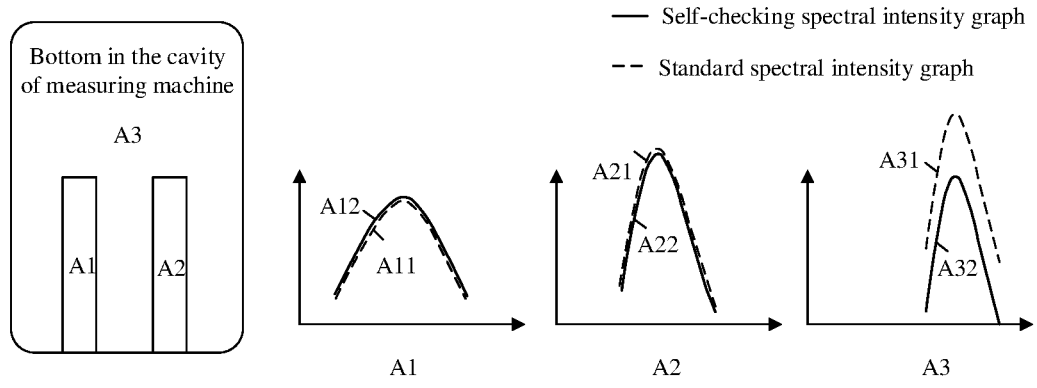
FIG. 12 illustrates a schematic diagram of the region division in the bottom of the cavity of the measuring machine and the corresponding spectral intensity graph provided by the embodiments of this application.

In some embodiments, dividing the inner wall of the cavity into N regions can be any number of regions divided by the technicians. FIG. 12 illustrates a schematic diagram of the division of the bottom region in the cavity of the measuring machine and the corresponding spectral intensity graphs provided by the embodiment of this application. As shown in FIG. 12, the bottom region in the cavity of the measuring machine is divided into 3 regions, namely A1, A2, and A3. The standard spectral intensity graphs for regions A1, A2, and A3 respectively, and the self-checking spectral intensity graphs (that is, the second spectral intensity graphs) for respective regions after a fixed number of the tasks have been performed are acquired.

It can be seen from FIG. 12 that the standard spectral intensity graph A11 for the A1 region and the self-checking spectral intensity graph A12 for the A1 region are almost overlapped, and have a high similarity, and therefore, it can be determined that there is no abnormality in the A1 region; the standard spectral intensity graph A21 for the A2 region and the self-checking spectral intensity graph A22 for the A2 region almost overlap, and have a high similarity, and therefore, it can be determined that there is no abnormality in the A2 region; the difference between the standard spectral intensity graph A31 for the A3 region and the self-checking spectral intensity graph A32 for the A3 region is large, and therefore, it can be determined that there is an abnormality in the A3 region, and an abnormal prompt can be issued so as to detect and maintain the A3 region in the cavity of the measuring machine.

In some embodiments, if the standard spectral intensity graph and the self-checking spectral intensity graph for each of the regions in the cavity of the measuring machine are not the same, it is necessary to not only check each of the regions inside the cavity of the measuring machine, but also check the sensitivity of the optical path.

In the device detection method provided by the embodiment of this application, the detection on the measuring machine can be realized by comparing the standard spectral intensity graph and the self-checking spectral intensity graph for each of the regions inside the cavity of the measuring machine, and the cleanliness detection on the cavity of the target device can be performed without a workpiece, and all of the regions inside the cavity can be detected, thereby improving detection efficiency and detection accuracy.

In the several embodiments provided in this application, it should be understood that the disclosed device and method can be implemented in a non-target manner. The device embodiments described above are merely illustrative. For example, the division of the units is only a logical function division, and there may be other divisions in actual implementation, such as: a plurality of units or components can be combined, or they can be integrated into another system, or some features can be ignored or not implemented. In addition, the components shown or discussed are coupled to each other or directly coupled.

The units described above as separate components may or may not be physically separate, and the components displayed as units may or may not be physical units, that is, they may be located in one place or distributed on a plurality of network units; Some or all of the units can be selected according to actual needs to achieve the objective of the solution of this embodiment.

The features disclosed in the several method or device embodiments provided in this application can be combined arbitrarily without conflict to obtain a new method embodiment or device embodiment.

The above are only some implementations of this application, but the protection scope of this application is not limited to this. Any person skilled in the art would easily conceive of changes or substitutions within the technical scope disclosed in this application, which should be covered within the protection scope of this application. Therefore, the protection scope of this application shall be subject to the protection scope of the claims.

The invention claimed is:

1. A device detection method for detecting a target device, comprising:
    acquiring one or more first spectral intensity graphs for one or more predetermined regions in a cavity of the target device;
    acquiring one or more second spectral intensity graphs for the one or more predetermined regions when the target device has finished N processing tasks, where N is a natural number; and
    detecting a cleanliness in the cavity of the target device according to the one or more first spectral intensity graphs and the one or more second spectral intensity graphs,
    wherein acquiring the one or more second spectral intensity graphs for the one or more predetermined regions comprises:
        emitting an emission light emitted by a light source to each one of the one or more predetermined regions in the cavity of the target device;
        receiving a refracted light refracted by the emission light from each one of the one or more predetermined regions; and
        obtaining a second spectral intensity graph for each one of the one or more predetermined regions according to the refracted light,
    wherein detecting the cleanliness in the cavity of the target device according to the one or more first spectral intensity graphs and the one or more second spectral intensity graphs comprises:
        analyzing a first spectral intensity graph and a second spectral intensity graph for each one of the one or more predetermined regions; and
        issuing an abnormal cleanliness prompt for a predetermined region of the one or more predetermined regions for which the first spectral intensity graph and the second spectral intensity graph are different when the first spectral intensity graph and the second spectral intensity graph for the predetermined region are different,
    wherein the method further comprises:
        performing a sensitivity detection on the emission light emitted by the light source when the first spectral intensity graph and the second spectral intensity graph for each one of the one or more predetermined regions are different.

2. The method according to claim 1, further comprising: before acquiring the one or more first spectral intensity graphs,
    dividing an inner wall of the cavity of the target device in a preset division manner so as to obtain a plurality of predetermined regions;
    wherein the preset division manner comprises equal area division or equal interval division.

3. The method according to claim 1, wherein issuing the abnormal cleanliness prompt for the predetermined region for which the first spectral intensity graph and the second spectral intensity graph are different comprises:
    issuing an abnormal voice prompt or an abnormal text prompt for the predetermined region for which the first spectral intensity graph and the second spectral intensity graph are different.

4. The method according to claim 1, wherein performing the sensitivity detection on the emission light emitted by the light source comprises:
    performing, by the target device, at least two processing tasks on a same task processing object, and acquiring third spectral intensity graphs of the same task processing object after each one of the at least two processing tasks; and
    detecting the emission light emitted by the light source according to a similarity between at least two of the third spectral intensity graphs.

5. The method according to claim 4, wherein detecting the emission light emitted by the light source according to the similarity between the at least two of the third spectral intensity graphs comprises:
    determining the emission light emitted by the light source to be normal when the similarity between the at least two of the third spectral intensity graphs is higher than a similarity threshold; or,
    determining the emission light emitted by the light source to be abnormal and issuing a light source abnormal prompt when the similarity between the at least two of the third spectral intensity graphs is lower than or equal to the similarity threshold.

6. A device detection system, comprising:
    a spectrometer, configured to form one or more second spectral intensity graphs for one or more predetermined regions in a cavity of a target device when the target device has finished N processing tasks, where N is a natural number;
    a light source, electrically connected to the spectrometer, for emitting an emission light;
    a lens system, electrically connected to the light source and configured to refract the emission light emitted by the light source to each one of the one or more predetermined regions;
    an optical signal receiver, electrically connected to the spectrometer, and configured to receive a refracted light refracted by the emission light from each one of the one or more predetermined regions and transmit an optical signal of the refracted light to the spectrometer;

an analysis device, electrically connected to the spectrometer and configured to receive one or more first spectral intensity graphs and the one or more second spectral intensity graphs for the one or more predetermined regions in the cavity of the target device, and detect a cleanliness in the cavity of the target device according to the one or more first spectral intensity graphs and the one or more second spectral intensity graphs; and an abnormal prompt structure, located in the analysis device, and configured to issue an abnormal voice prompt or an abnormal text prompt when a first spectral intensity graph and a second spectral intensity graph for a predetermined region of the one or more predetermined regions are different, wherein the analysis device is further configured to perform a sensitivity detection on the emission light emitted by the light source when the first spectral intensity graph and the second spectral intensity graph for each one of the one or more predetermined regions are different.

7. The device detection system according to claim 6, wherein the lens system comprises at least two zoom lenses, each of the at least two zoom lenses is configured to refract the emission light emitted from the light source to one of the one or more predetermined regions.

8. The device detection system according to claim 6, further comprising: a system controller, respectively electrically connected to the spectrometer and the analysis device, and configured to control the device detection system to perform cavity cleanliness detection on the target device.

9. The device detection system according to claim 6, wherein the abnormal prompt structure is further configured to issue the abnormal voice prompt or the abnormal text prompt when the emission light emitted by the light source is abnormal.

10. The device detection system according to claim 6, wherein the one or more predetermined regions are located at least on an inner bottom plate, an inner side wall, or an inner top plate in the cavity of the target device.

11. The device detection system according to claim 6, wherein the target device is a measuring device or a process device.

* * * * *